(12) United States Patent
Janett et al.

(10) Patent No.: US 11,152,707 B1
(45) Date of Patent: Oct. 19, 2021

(54) FAST RADIO FREQUENCY PACKAGE

(71) Applicant: INTERNATIONAL BUSINESS MACHINES CORPORATION, Armonk, NY (US)

(72) Inventors: Andreas Fuhrer Janett, Rueschlikon (CH); Stephan Paredes, Rueschlikon (CH); Thilo Hermann Curt Stoeferle, Rueschlikon (CH); Stefan Filipp, Erding (DE); Matthias Mergenthaler, Zurich (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/920,387

(22) Filed: Jul. 2, 2020

(51) Int. Cl.
*H01Q 13/08* (2006.01)
*H01Q 13/18* (2006.01)

(52) U.S. Cl.
CPC ............. *H01Q 13/08* (2013.01); *H01Q 13/18* (2013.01)

(58) Field of Classification Search
CPC ............................... H01Q 13/08; H01Q 13/18
See application file for complete search history.

(56) References Cited

U.S. PATENT DOCUMENTS

| 4,370,700 | A | * | 1/1983 | Duddles | ............... | H05K 9/0037 174/385 |
| 5,416,861 | A | * | 5/1995 | Koh | .................. | G02B 6/12007 385/14 |
| 6,355,976 | B1 | * | 3/2002 | Faris | .................... | H01L 23/3672 257/685 |
| 6,774,748 | B1 | * | 8/2004 | Ito | .......................... | H01L 23/057 257/664 |
| 7,791,539 | B2 | * | 9/2010 | Soler Castany | .......... | H01Q 9/26 343/700 MS |
| 8,558,365 | B1 | * | 10/2013 | Roa | ........................ | H01L 23/552 257/686 |
| 10,134,972 | B2 | | 11/2018 | Oliver et al. | | |
| 10,381,541 | B2 | | 8/2019 | Das et al. | | |
| 2005/0184825 | A1 | * | 8/2005 | Oran | ........................ | H01P 1/047 333/33 |
| 2010/0046184 | A1 | * | 2/2010 | Yasooka | ............... | H01L 23/043 361/767 |

(Continued)

FOREIGN PATENT DOCUMENTS

| CN | 107564868 B | 8/2019 |
| WO | 2018057024 A1 | 3/2018 |

(Continued)

*Primary Examiner* — Lam T Mai
(74) *Attorney, Agent, or Firm* — Intelletek Law Group, PLLC; Gabriel Daniel, Esq.

(57) ABSTRACT

A device package includes a chip carrier having a cavity and one or more microwave waveguides configured to route signals. There is a chip including one or more pads and located within the cavity of the chip carrier. Each pad is aligned with a corresponding connector pad of a microwave waveguide of the one or more microwave waveguides of the chip carrier. At least one of the one or more pads is coupled to the connector pad of the corresponding microwave waveguide by way of an overlap capacitive coupling between the at least one pad and the aligned corresponding connector pad of the microwave waveguide.

20 Claims, 8 Drawing Sheets

(56) References Cited

U.S. PATENT DOCUMENTS

| | | | | |
|---|---|---|---|---|
| 2011/0116237 A1* | 5/2011 | Samples | ............... | H01L 23/10 361/709 |
| 2011/0117705 A1* | 5/2011 | Samples | ............... | H01L 24/48 438/125 |
| 2013/0122833 A1* | 5/2013 | Hadjichristos | ......... | H01L 23/66 455/90.2 |
| 2014/0036471 A1* | 2/2014 | Yuen | ............... | H05K 7/02 361/813 |
| 2014/0062607 A1* | 3/2014 | Nair | ............... | H01L 23/5389 331/68 |
| 2014/0091440 A1* | 4/2014 | Nair | ............... | H01L 23/66 257/659 |
| 2015/0325548 A1* | 11/2015 | Read | ............... | H01L 23/552 438/106 |
| 2016/0035679 A1* | 2/2016 | Chen | ............... | H01L 21/52 361/736 |
| 2016/0099192 A1* | 4/2016 | Chen | ............... | H01L 24/97 361/772 |
| 2016/0240448 A1* | 8/2016 | Weinschenk | ............ | H01L 21/56 |
| 2016/0240491 A1* | 8/2016 | Weinschenk | ............ | H01L 23/564 |
| 2016/0240494 A1* | 8/2016 | Kim | ............... | H01L 23/057 |
| 2017/0352643 A1* | 12/2017 | Read | ............... | H01L 21/67132 |
| 2018/0096949 A1* | 4/2018 | Chen | ............... | H01L 23/49838 |
| 2018/0198436 A1* | 7/2018 | Joshi | ............... | H03H 9/17 |
| 2019/0198407 A1* | 6/2019 | Huang | ............... | H01L 23/66 |
| 2019/0273197 A1 | 9/2019 | Roberts et al. | | |
| 2020/0051952 A1* | 2/2020 | Read | ............... | H01L 23/66 |
| 2020/0052359 A1 | 2/2020 | Painter et al. | | |

FOREIGN PATENT DOCUMENTS

| | | |
|---|---|---|
| WO | 2018160184 A1 | 9/2018 |
| WO | 2018231212 A1 | 12/2018 |

\* cited by examiner

CROSS SECTION OF A PACKAGE

FAST RADIO FREQUENCY PACKAGE

BACKGROUND

Technical Field

The present disclosure generally relates to packaging chips, and more particularly to efficient packaging of superconducting devices.

Description of the Related Art

In order for a semiconductor chip to communicate with the outside world, it is typically encapsulated in a supporting case that not only facilitates communication with outside components, but also protects the chip both physically and thermally. Traditional packaging techniques typically rely on a "permanent" connection between the package and the encapsulated chip. Typical connections between the pads on the chip and the connector pads of the package may include permanent solder, wire bond, thermosonic bond, or other permanent bonding techniques, which make subsequent separation and replacement impracticable.

SUMMARY

According to an embodiment, a device package includes a chip carrier having a cavity and one or more microwave waveguides configured to route signals. There is a chip including one or more pads and located within the cavity of the chip carrier. Each pad is aligned with a corresponding connector pad of a microwave waveguide of the one or more microwave waveguides of the chip carrier. At least one of the one or more pads is coupled to the connector pad of the corresponding microwave waveguide by way of an overlap capacitive coupling between the at least one pad and the aligned corresponding connector pad of the microwave waveguides.

In one embodiment, the chip is a quantum chip.

In one embodiment, the chip carrier is a printed circuit board (PCB).

In one embodiment, there is a block configured to press the chip into the cavity of the chip carrier. The chip may be a quantum chip and the block may be a thermalization block operative to thermalize the quantum chip.

In one embodiment, the block includes one or more springs operative to press the chip onto the cavity of the chip carrier.

In one embodiment, the microwave waveguides are superconducting and comprise either a superconductor or copper coated with a superconductor. For example, the microwave waveguides can comprise niobium or copper coated by a superconductor such as tin.

In one embodiment, the superconducting microwave waveguides of the chip carrier are routed in three dimensions to a connector plane including a ball grid array (BGA).

In one embodiment, an alignment between the chip and the cavity of the chip carrier is within 0.2 times a width of the connector pad.

In one embodiment, the chip carrier includes a plurality of additional cavities. At least one additional cavity of the plurality of additional cavities includes a given chip having one or more pads located within the at least one additional cavity. Each pad of the given chip is aligned with a corresponding connector pad of a microwave waveguide of the chip carrier. At least one of one or more pads of the given chip is coupled to its aligned corresponding connector pad of the chip carrier by way of an overlap capacitive coupling.

In one embodiment, the chip is a quantum chip and the given chip is not a quantum chip.

According to one embodiment, a chip packaging system, includes a chip carrier having a cavity and one or more microwave waveguides configured to route signals. An interposer chip includes one or more pads and located within the cavity of the chip carrier. One or more chips are bonded to the interposer chip. Each pad of the interposer chip is aligned with a corresponding connector of a microwave waveguide of the one or more microwave waveguides of the chip carrier.

At least one of the one or more pads is coupled to the connector pad of the corresponding microwave waveguide by way of an overlap capacitive coupling between the at least one pad and the aligned corresponding connector pad of the microwave waveguide.

In one embodiment, the chip is a quantum chip, and the chip carrier is a printed circuit board (PCB).

In one embodiment, there is a block configured to press the interposer chip into the cavity of the chip carrier.

In one embodiment, the block includes one or more springs operative to press the interposer chip onto the cavity of the chip carrier.

According to one embodiment, a method of packaging a chip includes providing a chip carrier having a cavity and one or more microwave waveguides to route signals. A chip comprising one or more pads is guided into the cavity of the chip carrier. Each pad of the chip is aligned with a corresponding connector pad of a microwave waveguide of the one or more microwave waveguides of the chip carrier. At least one of the one or more pads is coupled to the connector of the corresponding microwave waveguide by way of an overlap capacitive coupling between the at least one pad and the aligned corresponding connector pad of the microwave waveguide.

In one embodiment, the chip is pressed into the cavity of the chip carrier by a thermalization block.

In one embodiment, the pressing includes one or more springs of the thermalization block pressing the chip onto the cavity of the chip carrier.

In one embodiment, the chip carrier includes a plurality of additional cavities. At least one additional cavity of the plurality of additional cavities includes a given chip having one or more pads located within the at least one additional cavity. Each pad of the given chip is aligned with a corresponding connector pad of a microwave waveguide of the chip carrier. At least one of one or more pads of the given chip is coupled to its aligned corresponding connector pad of the chip carrier by way of an overlap capacitive coupling.

In one embodiment, the functionality of the chip is determined. Upon determining that the chip is defective, the chip is removed and replaced with a new chip.

These and other features will become apparent from the following detailed description of illustrative embodiments thereof, which is to be read in connection with the accompanying drawings.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

DETAILED DESCRIPTION

Overview

In the following detailed description, numerous specific details are set forth by way of examples to provide a thorough understanding of the relevant teachings. However, it should be apparent that the present teachings may be practiced without such details. In other instances, well-known methods, procedures, components, and/or circuitry have been described at a relatively high-level, without detail, to avoid unnecessarily obscuring aspects of the present teachings.

In one aspect, spatially related terminology such as "front," "back," "top," "bottom," "beneath," "below," "lower," above," "upper," "side," "left," "right," and the like, is used with reference to the orientation of the Figures being described. Since components of embodiments of the disclosure can be positioned in a number of different orientations, the directional terminology is used for purposes of illustration and is in no way limiting. Thus, it will be understood that the spatially relative terminology is intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

As used herein, the terms "lateral" and "horizontal" describe an orientation parallel to a first surface of a chip.

As used herein, the term "vertical" describes an orientation that is arranged perpendicular to the first surface of a chip, chip carrier, or semiconductor body.

As used herein, the terms "coupled" and/or "electrically coupled" are not meant to mean that the elements must be directly coupled together—intervening elements may be provided between the "coupled" or "electrically coupled" elements. In contrast, if an element is referred to as being "directly connected" or "directly coupled" to another element, there are no intervening elements present. The term "electrically connected" refers to a low-ohmic electric connection between the elements electrically connected together.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

Example embodiments are described herein with reference to cross-sectional illustrations that are schematic illustrations of idealized or simplified embodiments (and intermediate structures). As such, variations from the shapes of the illustrations as a result, for example, of manufacturing techniques and/or tolerances, may be expected. Thus, the regions illustrated in the figures are schematic in nature and their shapes do not necessarily illustrate the actual shape of a region of a device and do not limit the scope.

It is to be understood that other embodiments may be used and structural or logical changes may be made without departing from the spirit and scope defined by the claims. The description of the embodiments is not limiting. In particular, elements of the embodiments described hereinafter may be combined with elements of different embodiments.

The present disclosure generally relates to fast and easily replaceable packaging of chips. By way of example only and not by way of limitation, the concepts herein are discussed in the context of quantum technology and quantum chips, while it will be understood that these teachings can be applied to different types of chips as well. Regarding quantum technology, the electromagnetic energy associated with a qubit can be stored, for example, in so-called Josephson junctions and in the capacitive and inductive elements that are used to form the qubit. In other examples, there may be spin qubits coupled to resonators or topological qubits, microfabricated ion traps, etc. Other types of microwave components that may be adjusted or readily replaced are supported by the teachings herein as well, including (without limitation), circulators, isolators, amplifiers, filters, active control electronics such as rapid single flux quantum (RSFQ), etc.

In one example, to read out the qubit state, a microwave signal is applied to the microwave readout cavity that couples to the qubit at the cavity frequency. The transmitted (or reflected) microwave signal goes through multiple thermal isolation stages and low-noise amplifiers that are used to block or reduce the noise and improve the signal-to-noise ratio. The amplitude and/or phase of the returned/output microwave signal carries information about the qubit state, such as whether the qubit has dephased to the ground or excited state. The microwave signal carrying the quantum information about the qubit state is usually weak (e.g., on the order of a few microwave photons). Various circuits and techniques can be used to measure this weak signal. For example, low-noise quantum-limited amplifiers (QLAs), such as Josephson amplifiers and travelling-wave parametric amplifiers (TWPAs), may be used as preamplifiers at the output of the quantum system to boost the quantum signal, while adding the minimum amount of noise as dictated by quantum mechanics, in order to improve the signal to noise ratio of the output chain. In addition to Josephson amplifiers, certain Josephson microwave components that use Josephson amplifiers or Josephson mixers such as Josephson circulators, Josephson isolators, and Josephson mixers can be used in scalable quantum processors.

The ability to include more qubits is salient to being able to realize the potential of quantum computers. Applicants have recognized that to increase the computational power and reliability of a quantum computer, improvements can be made in various dimensions. First, is the qubit count itself. The more qubits in a quantum processor, the more states can in principle be manipulated and stored. Second is low error rates, which is relevant to manipulate qubit states accurately and perform sequential operations that provide consistent results and not merely unreliable data. Third, qubit technology is still a developing field and providing a qubit having a predetermined frequency with high precision is a challenge. For example, in some scenarios, a consistent fabrication of a qubit to have a 5.20 GHz center frequency, may not be repeatedly achieved. It would therefore be desirable to have a modular system with multiple quantum chips and to be able to easily replace qubits that do not have a desired center frequency or are simply defective.

Thus, to improve fault tolerance of a quantum computer system, a large number of physical qubits should be used to store a logical quantum bit. In this way, the local information is delocalized such that the quantum computer is less susceptible to local errors and the performance of measurements in the qubits' eigenbasis, similar to parity checks of classical computers, thereby advancing to a more fault tolerant quantum bit.

In order for a semiconductor chip such as a quantum chip to communicate with outside world, it is typically coupled to or encapsulated in a supporting case that not only facilitates communication, but also protects the quantum chip both physically and thermally. Existing supporting cases can be subject to different challenges. For example, conventional bonding is a time and resource consuming process that may not provide adequate impedance matching in the transition between a chip carrier, such as a printed circuit board (PCB), to the chip. Further, traditional bonds may reduce the ability to provide a cavity around the chip for efficient guidance of the chip onto the PCB or provide adequate access to the relevant chip surface for treatments or inspection.

Traditional packaging techniques may involve vertical through-silicon vias (TSVs), which usher in fabrication challenges and may impact coherence during the fabrication process. The package may even strain the chip during cooldown. For example, point forces on the chip, such as from pogo pins, may lead to chip breakage. Differences in expansion coefficients between the chip and the package may strain the chip (e.g., laterally). Still further, in traditional quantum chip packages, the overlap of lossy/normal materials with the different modes of the qubits may induce loss, collectively referred to herein as package induced decoherence.

The concepts discussed herein provide various improvements to encapsulating chips, such as quantum chips, as will be described in more detail below. For example, by virtue of the freedom from physical bonding between the pads of the chip and the corresponding connector pads on the chip carrier, such as a PCB, the effort and time to couple the chip and the PCB is substantially reduced. The ease and flexibility of removing chips from the PCB allows chips to be easily individually replaced with different chips that meet desired criteria. Such flexibility may be particularly helpful, for example, in coherence experiments and material assessment. Also, chips can be easily replaced with those having a more desirable qubit frequency because there are no physical bonds to be removed and reintroduced during replacement. The chip carrier and corresponding connector pads can be readily reused due to the absence of physical bonding wires connected between the chip and the PCB. Since the chip is not mechanically fixed to the chip carrier as in traditional packages, the strain during a cooldown is alleviated. Further, in some embodiments, the teachings herein readily facilitate multi-chip modular devices.

The techniques described herein may be implemented in a number of ways. Example implementations are provided below with reference to the following figures.

Example Packaging Architectures

Figure 1A:
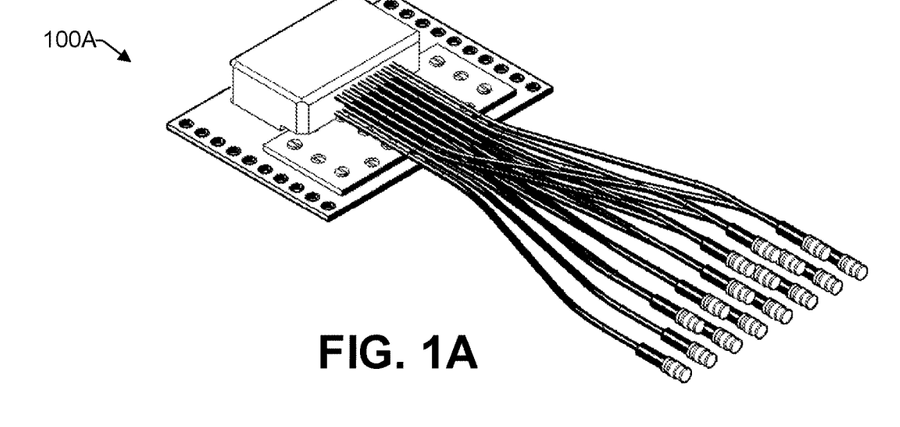
FIG. 1A provides a perspective view of a packaged chip, consistent with an illustrative embodiment.

FIGS. 1A to 1D collectively provide an overview of a system that illustrates different aspects of the present packaging concepts, consistent with an illustrative embodiment. More specifically, FIG. 1A provides a perspective view of a packaged chip 100A. In various scenarios, the packaged chip may operate at room temperature or at cryogenic temperatures. The coaxial wires 102 may be coupled to various test and measurement equipment (e.g., operated at room temperature) to determine whether one or more chips connected to the chip carrier should be replaced by the simple removal and plug in of the chip described herein. In various embodiments, the wires on the chip carrier may be microstrips and/or coplanar waveguides (CPWs). In one embodiment, the chip carrier is a PCB.

Figure 1B:
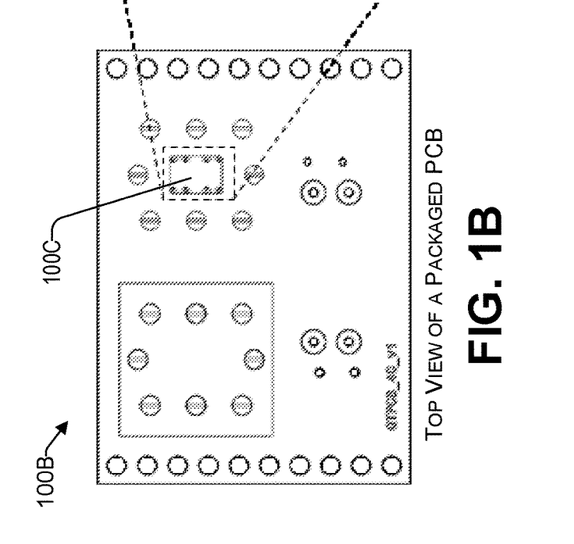
FIG. 1B provides a top view of the printed circuit board of FIG. 1A, having a cutout, consistent with an illustrative embodiment.
Figure 1C:
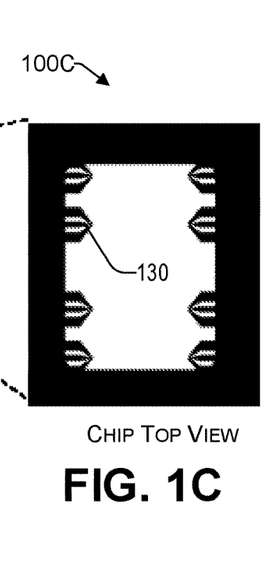
FIGS. 1C and 1D illustrate a top view and a bottom view, respectively, of the chip having a waveguide launcher, consistent with an illustrative embodiment.
Figure 1D:
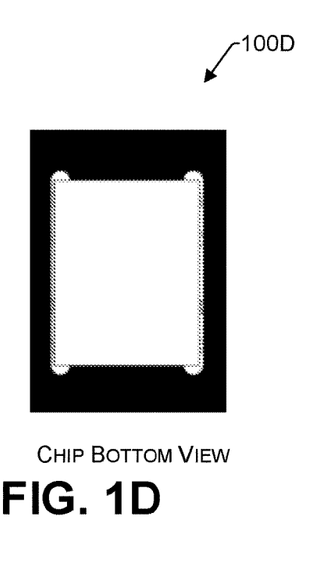

FIG. 1B provides a top view 100B of the PCB of FIG. 1A, having a cutout operative to receive a chip 100C. A chip 100C can be placed (e.g., plugged in) directly onto the connector pads of the PCB (e.g., coplanar waveguide (CPW) lines in the PCB). In this regard, FIGS. 1C and 1D illustrate a top view and a bottom view, respectively, of the chip having a waveguide launcher 130. There are equivalent waveguide launchers on the PCB 100B that face the waveguide launchers (e.g., 130) of the chip. For example, the center wire in the waveguide launcher 130 is the signal wire, and the outer two wires are ground. Each waveguide launcher acts as a pad that is connected by way of capacitive coupling.

Figure 2A:
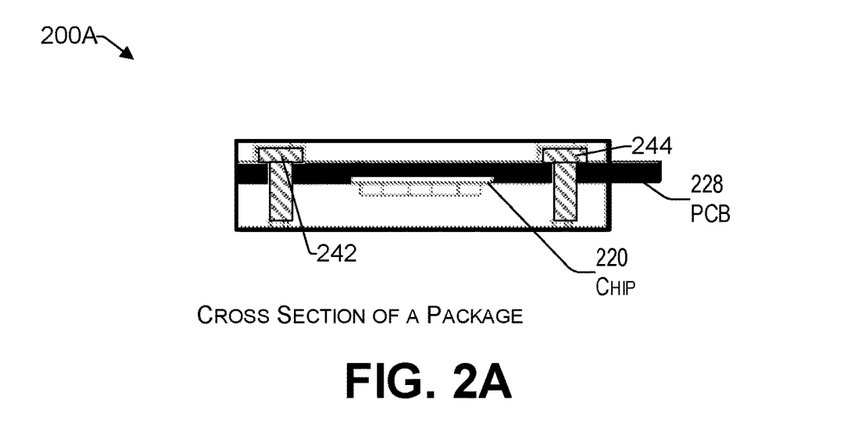
FIG. 2A provides a cross section view of a package, consistent with an illustrative embodiment.
Figure 2B:
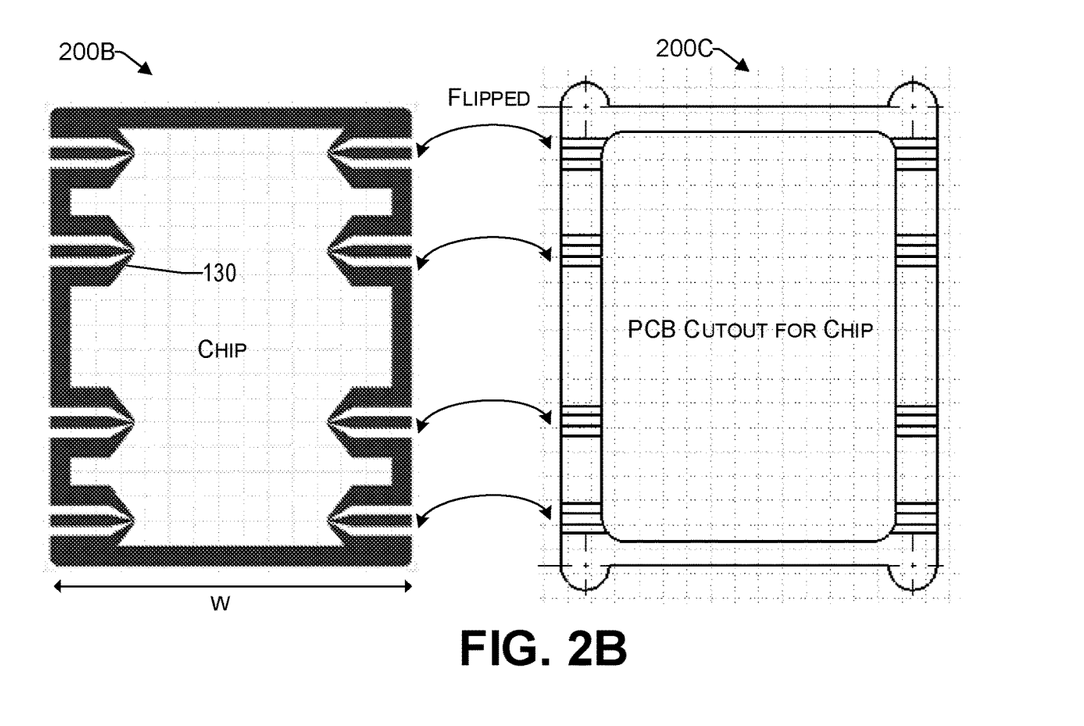
FIG. 2B illustrates a chip carrier cutout that is configured to accept a chip, consistent with an illustrative embodiment.

Reference now is made to FIG. 2A, which provides a cross section view of a package 200A, consistent with an illustrative embodiment. FIG. 2A includes a chip 220 that is communicatively coupled with a PCB by way of capacitive coupling between the pads on the chip 220 and corresponding connector pads on the PCB 228. The actual connector pads and the pads of the chip are not shown in FIG. 2A but are discussed in more detail later, including in the context of FIG. 2B. For example, by way of capacitive coupling, signals from the chip 220 are transmitted through the connector pads on the PCB 228 and travel through a CPW that leads to launching pads of the PCB 228. Two fasteners 242 and 244 are used to press the chip into the PCB recess and align the chip, PCB and thermalization block (discussed in more detail in the context of FIG. 5) with each other. These launching pads on the chip 220 are aligned with corresponding connector pads on the PCB 228, respectively, and are able to communicate by sending microwave signals by way of capacitive coupling. In this regard, FIG. 2B illustrates a chip carrier (e.g., PCB) having a cutout 200C that is configured to accept a chip 200B. For example, the chip 200B can be placed (e.g., flipped) onto the PCB cutout 200C, where the pads on the chip 130 (e.g., sometimes referred to herein as waveguides or waveguide launchers) align with the corresponding connector pads on the PCB in the cutout 200C.

Accordingly, the chip (which may be a quantum chip) can be placed (e.g., flip chipped) directly onto a cutout of a chip carrier (e.g., PCB) without requiring a physical connection between the pads of the chip and the connector pads on the chip carrier. For example, the architectures described herein do not require a permanent solder, wire, thermosonic, or other permanent bonding between the chip and the PCB. Instead, the chip 200B is flipped and positioned onto the cavity of the chip carrier such that pads on the chip are immediately aligned with and facing the connector pads on the chip carrier (e.g., PCB). The actual transmission of signals between a pad of the chip and its corresponding connector on the chip carrier is way of capacitive coupling (i.e., large overlapping capacitance between the pad on the chip and the corresponding connector on the PCB). The chip and the PCB are held together in a non-invasive and non-permanent and easily removable way to package the chip, discussed in more detail below.

Thus, the capacitive coupling between the pads (e.g., waveguide launchers) of the chip and the corresponding connector pads of the PCB facilitate communication between the chip and the PCB. The CPWs of the PCB can be used to route signals between different chips and/or devices. In one embodiment, superconducting lines and/or vias can be used in the PCB (e.g., tin coated copper) to route signals in three dimensions and/or to connect the signals to a connector plane (e.g., ball grid array).

In one embodiment, the chip 200B is aligned laterally to better than the dimension of ~0.2*w, where w is the width of the connector (e.g., capacitor) pad. For example, the alignment is better than 50 um. Applicants have determined that such tolerance provides adequate overlap between the pads of the chip and the connector pads on the chip carrier (e.g., PCB having a cutout to accept the chip) such that a desired overlap capacitance is achieved for reliable capacitive coupling. Such alignment is provided by making a precise cutout in the PCB 200C to which the chip 200B is guided. The chip 200B is pressed against the PCB such as to minimize the distance "d" (see FIG. 5) between the pad on the chip and its corresponding connector on the PCB. In various embodiments, the minimization of the distance d can be implemented with a spring-based mechanism or with thermal structure (e.g., copper block) that clamps the chip 200B and PCB between two parts with a fastener (e.g., screw, clamp, etc.). These concepts are discussed in more detail later.

Figure 3:
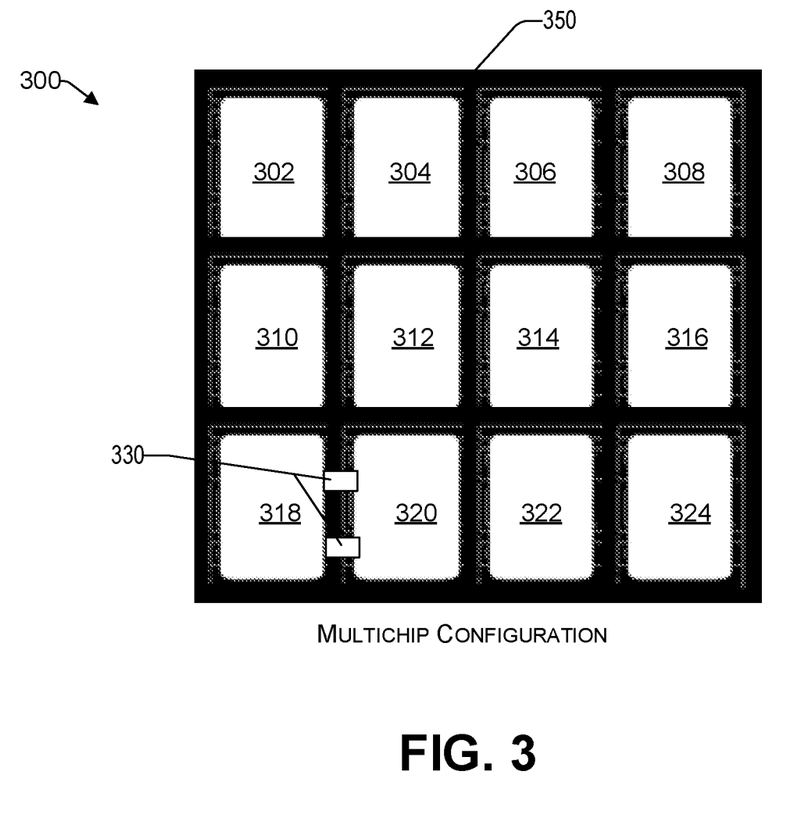
FIG. 3 illustrates a multichip configuration of a package, consistent with an illustrative embodiment.

While a chip carrier that is configured to accept a single chip is shown by way of example in FIGS. 1A and 2B, it will be understood that the teachings herein are not limited thereto. In this regard, reference now is made to FIG. 3, which illustrates a multichip configuration 300 of a package, consistent with an illustrative embodiment. In various embodiments, the multichip configuration 300 may comprise an array of similar (e.g., qubit) chips 302 or a combination of different type of chips (e.g., control logic, amplifiers, readout circuitry, power supply, quantum chip, etc.,) that are communicatively connected to the PCB 350 by way of capacitive coupling between the pads of the chips 302 to 324 and their corresponding connector pads on the multichip PCB 350. Two or more of the chips 302 to 324 can communicate with each other by way of capacitive coupling between the pads on the chips and connector pads on the PCB 350. If any of the chips 302 to 324 do not function adequately, that chip can be easily replaced with another chip by way of a quick removal of the old chip and insertion of the new chip. Such flexibility is afforded by virtue of the chips 302 to 324 not being permanently connected to the PCB 350 but capacitively coupled. In this way, the functionality of the multichip configuration 300 can be facilitated and readily maintained over time.

Figure 4:
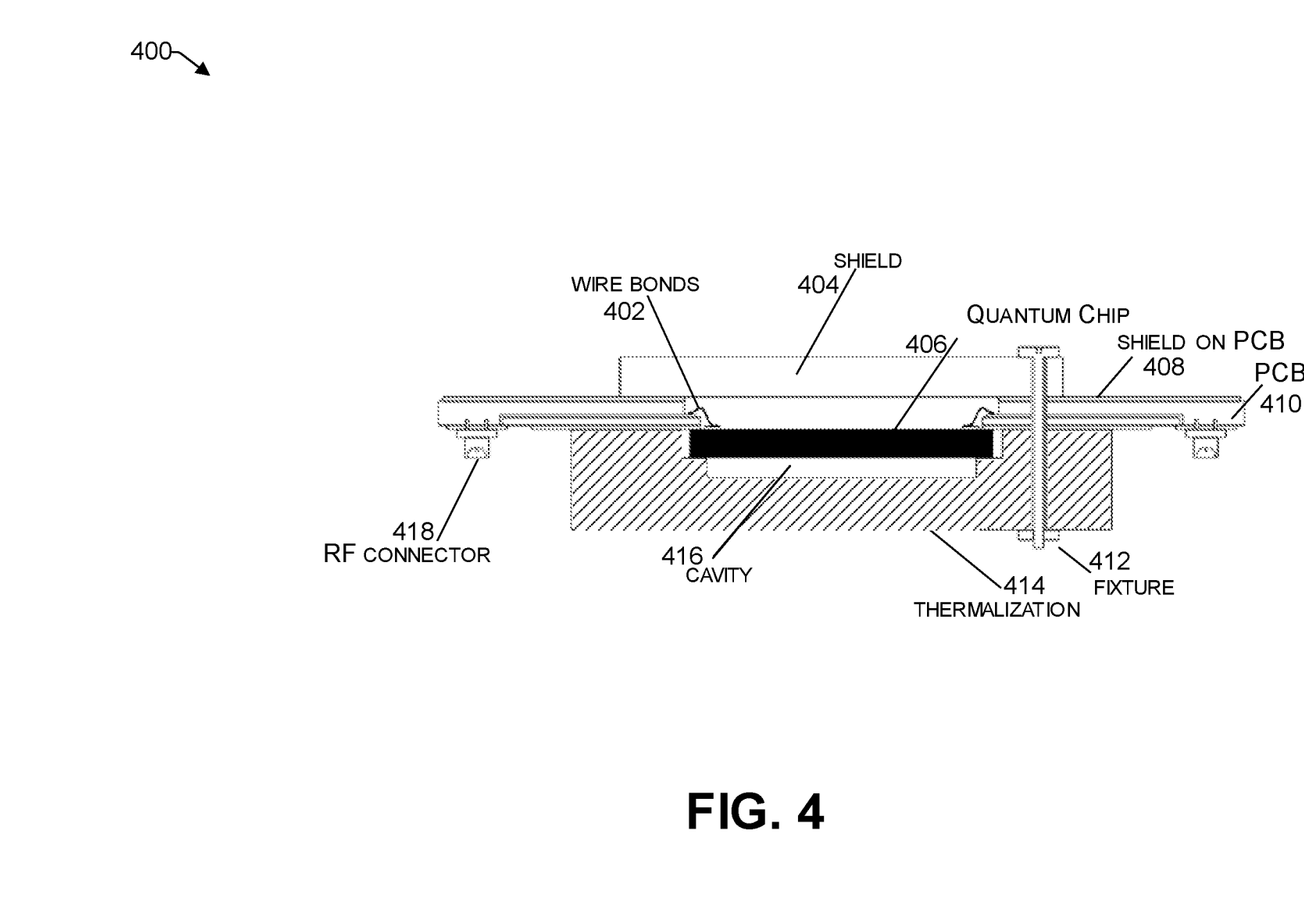
FIG. 4 provides a cross-section of chip coupled to a printed circuit board by way of wire bonds, consistent with an illustrative embodiment.

To better appreciate the features of the teachings herein, it may be helpful to provide a comparison to a known packaging technology. To that end, FIG. 4 provides a cross-section of chip coupled to PCB 410 by way of wire bonds 402. Structure 400 includes a thermalization structure 414, sometimes referred to as a (e.g., copper) pusher block, operative to hold the chip 406 over a cavity 416. The quantum chip 406 is itself physically connected to the PCB 410 by way of permanent wire bonds (e.g., 402). There is typically a shield 404 operative to encapsulate the quantum chip 406. The shield 404 is held to the top surface of the PCB 410 by way of a fixture 412 that mechanically clamps or screws the shield 404 to the PCB 410 and the thermalization structure 414. There may be a shield 408 on the PCB. The PCB may include an RF connector 418 operative to communicate with other components by way of RF signals. Since wire bonds (e.g., 402) are a relatively permanent connection, the quantum chip 406 cannot be readily replaced.

Figure 5:
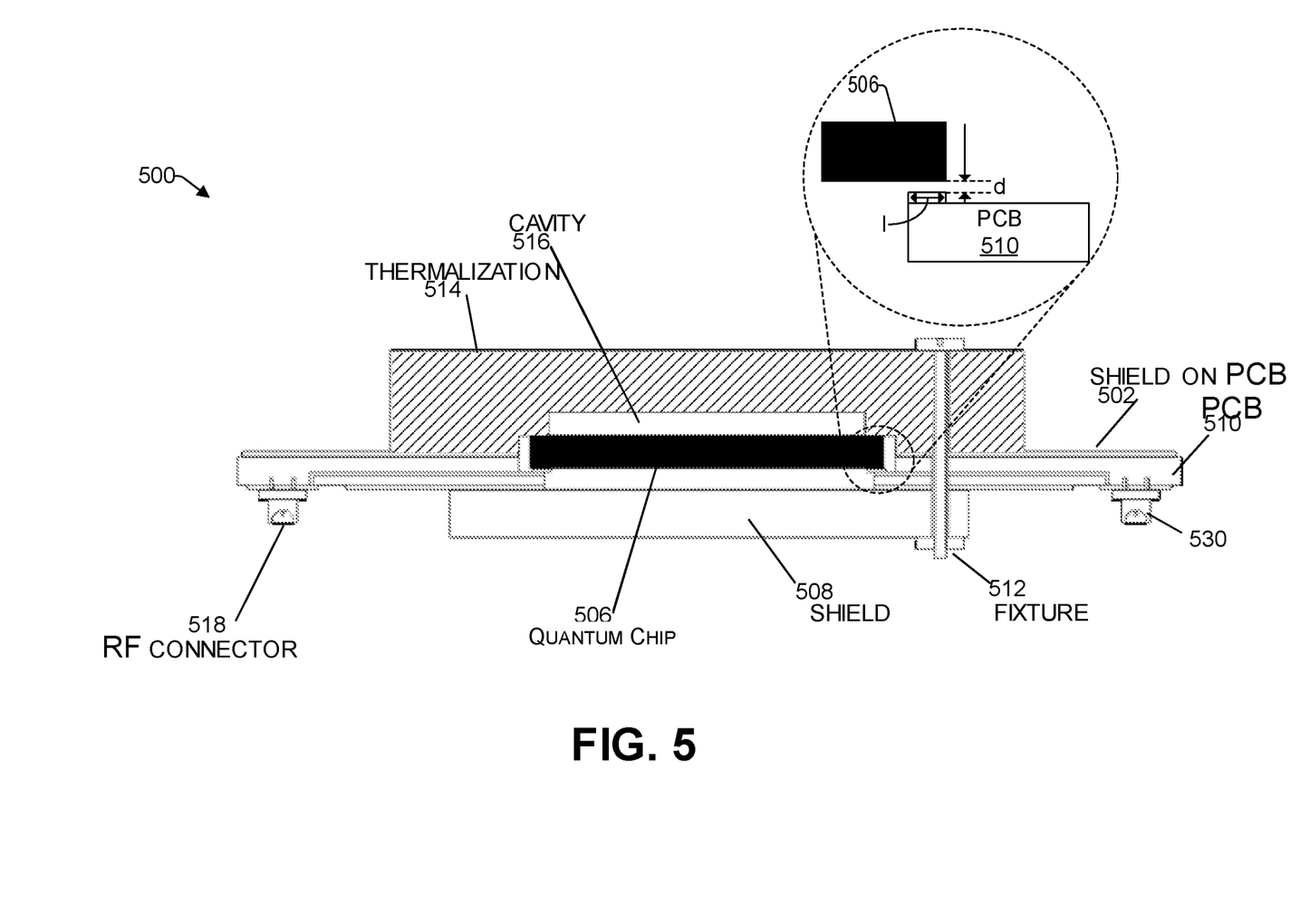
FIG. 5 is a cross-section view of chip coupled to a printed circuit board by way of capacitive coupling, consistent with an illustrative embodiment.

By way of contrast, reference now is made to FIG. 5, which is a cross-section of chip 506 coupled to a chip carrier (e.g., PCB) 510 by way of capacitive coupling, consistent with an illustrative embodiment. Structure 500 includes a thermalization structure 514 operative to hold the chip (e.g., quantum chip and/or control chip) 506 below a cavity 516. The thermalization structure 514 may comprise copper. In some embodiments, there is a shield 508 operative to complete the encapsulation of the chip 506 and to protect the chip surface from stray fields or external influences. The shield can be mechanically fixed to the bottom surface of the chip carrier (e.g., PCB) 510 by way of a fixture 512 that mechanically clamps or screws both the shield 508 and the thermalization structure 514 to the PCB 510. The clamping provided by the fixture 512 ensures that the thermal contact between the thermalization structure 514 and the chip 506 is sufficient. A good thermal and electrical contact to ground is achieved either with the copper block or already through the large ground contacts at all edges of the chip (e.g., wherever there is no waveguide). In one embodiment, there is a shield 502 on the PCB 510 that is operative to protect the chip circuitry from electro-magnetic (EM) disturbances providing a defined cavity.

The PCB 510 may include one or more RF connectors (e.g., 518 and 530), which are operative to communicate with other components by way of RF signals. Significantly, the connection between the pads on the chip 506 and the connector pads of the PCB 510 are not by way of a permanent connection (e.g., permanent solder, wire, thermosonic, or other permanent bonding). Rather, one or more connections between the chip 506 and the chip carrier 310 are by way of capacitive coupling between the pads on the chip 506 and the connector pads on the PCB 510 having a distance d. In one example the overlap between a pad of the chip 506 and the chip carrier is about 500 um. With a CPW launcher (sometimes referred to herein as a pad of the chip)

width of 100 um, a coupling capacitance of 500 fF has been observed, with less than 5 dB attenuation of the signal. By virtue of such non-permanent connection, the chip 506 can readily be removed and replaced from the chip carrier 510. It is appreciated that while distance "d" is shown as a visible gap in the expanded view, this gap occurs despite the chip 506 being pressed against the PCB 510 by way of the thermalization structure 514 and the fixture 512. In particular, as previously indicated, distance "d" can be minimized by increasing the contact pressure between the chip 506 and PCB 510. This subsequently results in a reduced distance "d" and a corresponding increase in the coupling capacitance between a pad of the chip 506 and the PCB 510. In some embodiments, coupling capacitance can be varied by controlling the distance "d" based on applied mechanical pressure (e.g., via screw fixtures, springs, etc.,) between a chip and a chip carrier.

Figure 8A:
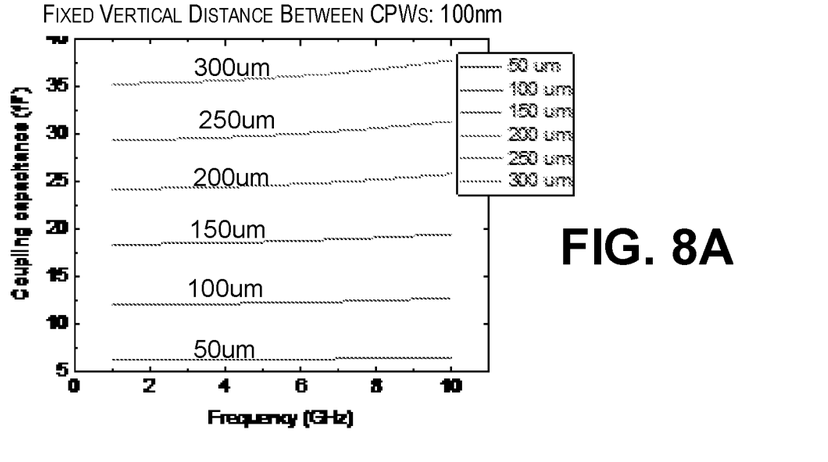
FIGS. 8A to 8C provide example simulation results of coupling capacitance between the pad of a chip and a connector pad on a printed circuit board for a fixed vertical distance between the coplanar waveguides of 100 nm.
Figure 8B:
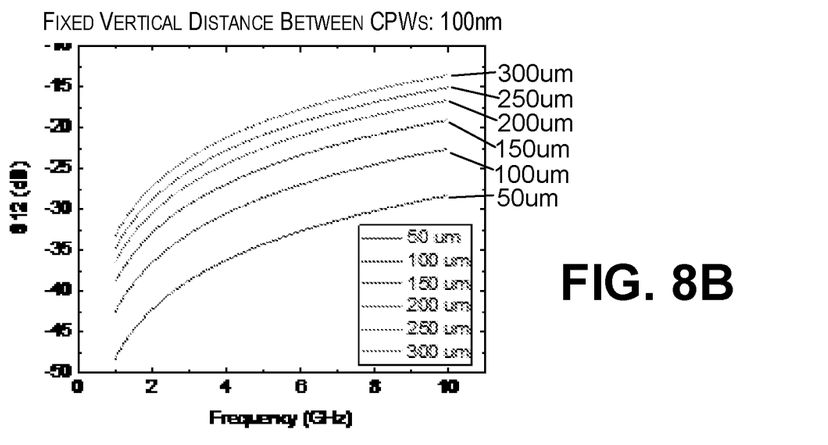
Figure 8C:
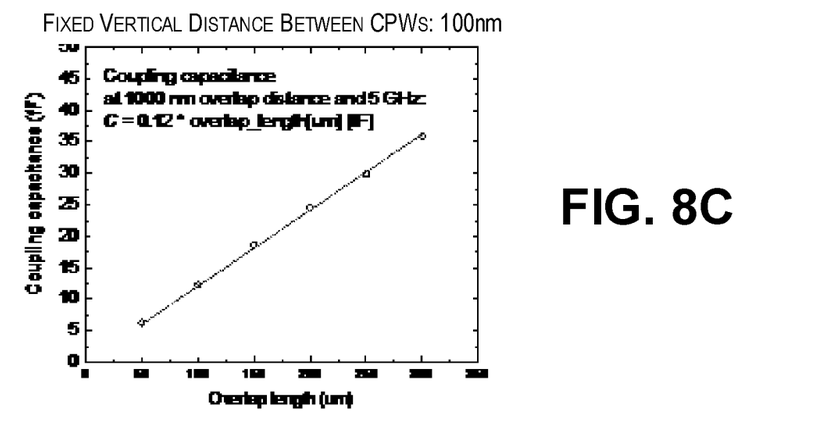

Accordingly, the waveguide is brought towards the edge of the chip and configured as a waveguide launcher, sometimes referred to herein as a chip pad. The lateral dimensions (w) of the chip pad are configured in size in such a way that the impedance stays the same but the size of w grows e.g., from 10 um to 200 um. There is a corresponding waveguide that is exposed on the chip carrier (e.g., PCB) 510 side within an overlap region. In one embodiment, the length "1" is approximately 1 um. Thus, placing the chip on the chip carrier, the two ends of these waveguides (e.g., the chip pad and the connector on the chip carrier) form a plate capacitor of length 1 and width w. Applicants have determined that if the "1" and "w" are large enough (Typically 1=500 um, w=100-200 um) the capacitive coupling is sufficiently large that transmission from chip to PCB is adequate even if there is a separation "d" between the surface of the chip and the surface of the PCB (each having its corresponding waveguide). In this regard, FIGS. 8A to 8C provide example simulation results of coupling capacitance between the pad of a chip and a connector on a PCB (i.e., their corresponding CPWs) for a fixed vertical distance between the CPWs of 100 nm. FIG. 8C demonstrates that the capacitance is linear with the length 1 of the overlap.

Figure 6:
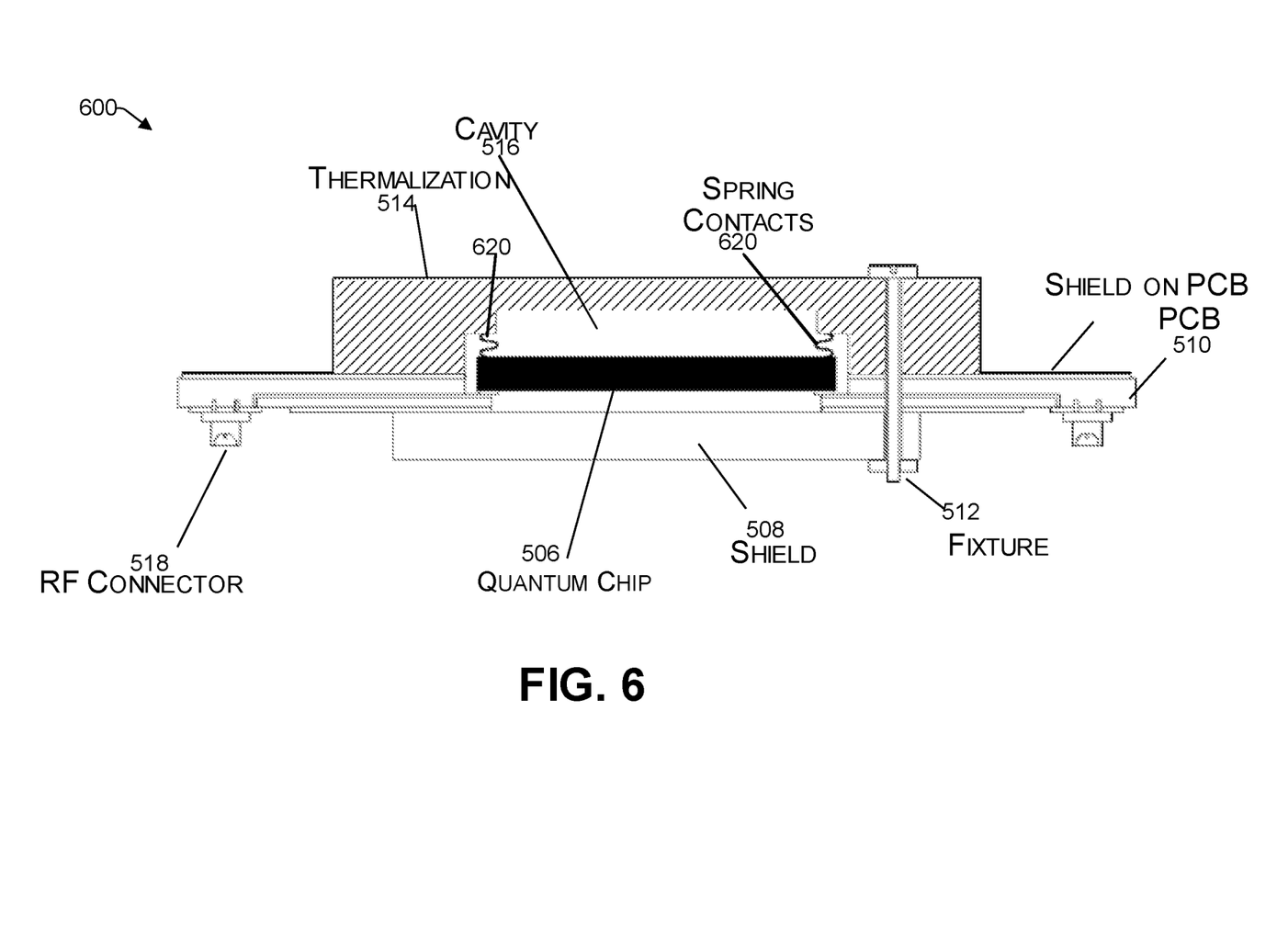
FIG. 6 is a cross-section view of a chip coupled to a printed circuit board having a spring loaded thermalization structure, consistent with an illustrative embodiment.

FIG. 6 is a cross-section view of a chip 506 coupled to the PCB 510 having a spring loaded thermalization structure 514, consistent with an illustrative embodiment. Many components of FIG. 6 are substantially similar to those of FIG. 5 and are therefore not repeated here for brevity. The main difference is that there are one or more spring contacts 620 between the thermalization structure 514 and the chip 506, sometimes referred to herein as being spring loaded. Spring loading can help to have a defined constant force on the chip, compensating geometry changes due to cool down. Accordingly, the chip 606 is pressed to the connector pads of the chip carrier by spring contacts pressing down on its back. The actual coupling between the pads of the chip 606 and the connector pads on the PCB is by way of the capacitive coupling discussed herein.

Figure 7:
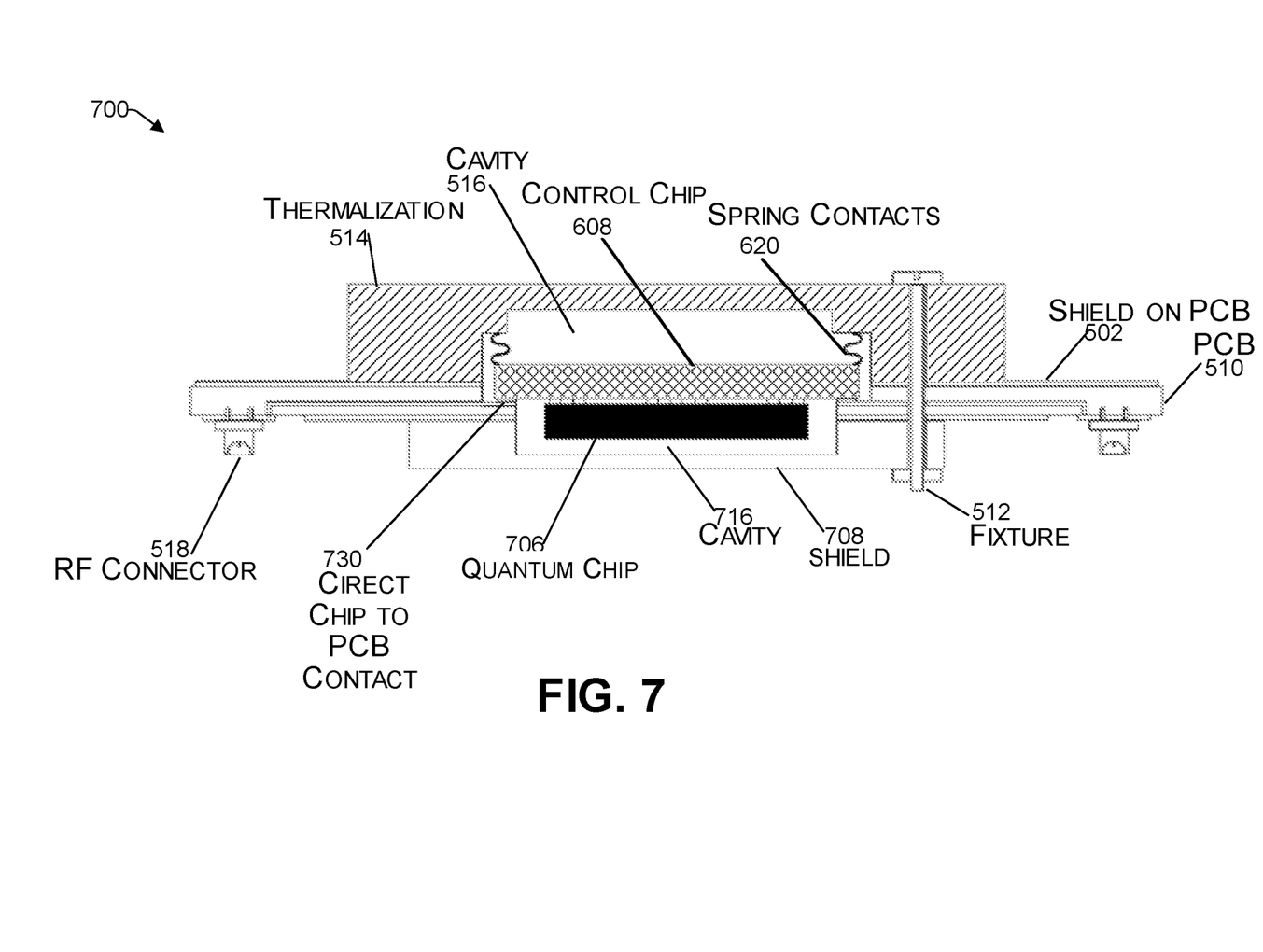
FIG. 7 is a cross-section view of a structure having a chip that is coupled to a printed circuit board having a carrier chip, consistent with an illustrative embodiment.

FIG. 7 is a cross-section 700 of a structure having a chip 706 that is coupled to the chip carrier (e.g., PCB) 510 having a carrier chip 608, consistent with an illustrative embodiment. Many components of FIG. 7 are substantially similar to those of FIGS. 5 and 6 and are therefore not repeated here for brevity. One salient difference between FIG. 6 and FIG. 7 is that the (e.g., qubit) chip 608 is not immediately connected to the chip carrier (e.g., PCB) 510. Rather, the chip 606 is connected to an interposer chip 608, sometimes referred to herein as a control chip by way of ball grid array (BGA), wherein the interposer chip 608 is coupled to the chip carrier 510 by way of capacitive coupling. FIG. 7 illustrates that the chip 606 is within a cavity 716 of the shield 708. The quantum chip 706 can be coupled via superconducting interconnects (e.g., In-bumps) or similar to the control chip 608. Advantageously, such sandwiched chips could easily be replaced and do not need to be wire bonded to a PCB.

In one embodiment, a plurality of similar types of chips (e.g., quantum chips) or a combination of different types of chips are coupled to the interposer chip 608 by way of "permanent" connection. The interposer chip 608 itself is coupled to the chip carrier (e.g., PCB) 510 by way of the capacitive coupling as discussed above.

The architectures discussed herein are useful in different fields, including, without limitation, microwave packaging (e.g., for quantum engineering, quantum chips, superconducting quantum chips), quantum technology (e.g., quantum processors, packaging of quantum systems, packaging of superconducting qubits, etc.), cryogenics (e.g., thermalization, signal delivery, cryogenic microwave measurements, etc.), and the like.

Conclusion

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A device package, comprising:
   a chip carrier having a cavity and one or more microwave waveguides configured to route signals; and
   a chip comprising one or more pads and located within the cavity of the chip carrier wherein:
      each pad is aligned with a corresponding connector pad of a microwave waveguide of the one or more microwave waveguides of the chip carrier; and
      at least one of the one or more pads is coupled to the connector pad of the corresponding microwave waveguide by way of an overlap capacitive coupling between the at least one pad and the aligned corresponding connector pad of the microwave waveguide.

2. The device package of claim 1, wherein the chip is a quantum chip.

3. The device package of claim 1, wherein the chip carrier is a printed circuit board (PCB).

4. The device package of claim 1, further comprising a block configured to press the chip into the cavity of the chip carrier.

5. The device package of claim 4, wherein:
   the chip is a quantum chip; and
   the block is a thermalization block operative to thermalize the quantum chip.

6. The device package of claim 4, wherein the block includes one or more springs operative to press the chip onto the cavity of the chip carrier.

7. The device package of claim 1, wherein the microwave waveguides are superconducting and comprise niobium or copper coated by a superconductor.

8. The device package of claim 1, wherein the superconducting microwave waveguides of the chip carrier are routed in three dimensions to a connector plane comprising a ball grid array (BGA).

9. The device package of claim 1, wherein an alignment between the chip and the cavity of the chip carrier is within 0.2 times a width of a connector pad.

10. The device package of claim 1, wherein:
    the chip carrier comprises a plurality of additional cavities;
    at least one additional cavity of the plurality of additional cavities comprises a given chip having one or more pads located within the at least one additional cavity;
    each pad of the given chip is aligned with a corresponding connector pad of a microwave waveguide of the chip carrier; and
    at least one of one or more pads of the given chip is coupled to its aligned corresponding connector pad of the chip carrier by way of an overlap capacitive coupling.

11. The device package of claim 10, wherein:
    the chip is a quantum chip; and
    the given chip is not a quantum chip.

12. A chip packaging system, comprising:
    a chip carrier having a cavity and one or more microwave waveguides configured to route signals;
    an interposer chip comprising one or more pads and located within the cavity of the chip carrier; and
    one or more chips bonded to the interposer chip, wherein:
       each pad of the interposer chip is aligned with a corresponding connector pad of a microwave waveguide of the one or more microwave waveguides of the chip carrier; and
       at least one of the one or more pads is coupled to the connector pad of the corresponding microwave waveguide by way of an overlap capacitive coupling between the at least one pad and the aligned corresponding connector pad of the microwave waveguide.

13. The chip packaging system of claim 12, wherein:
    the interposer chip is a quantum chip; and
    the chip carrier is a printed circuit board (PCB).

14. The chip packaging system of claim 12, further comprising a block configured to press the interposer chip into the cavity of the chip carrier.

15. The chip packaging system of claim 14, wherein the block includes one or more springs operative to press the interposer chip onto the cavity of the chip carrier.

16. A method of packaging a chip, comprising:
    providing a chip carrier having a cavity and one or more microwave waveguides to route signals;
    guiding a chip comprising one or more pads into the cavity of the chip carrier;
    aligning each pad of the chip with a corresponding connector pad of a microwave waveguide of the one or more microwave waveguides of the chip carrier; and
    coupling at least one of the one or more pads to the connector pad of the corresponding microwave waveguide by way of an overlap capacitive coupling between the at least one pad and the aligned corresponding connector pad of the microwave waveguide.

17. The method of claim 16, further comprising pressing the chip into the cavity of the chip carrier with a thermalization block.

18. The method of claim 17, wherein the pressing comprises one or more springs of the thermalization block pressing the chip onto the cavity of the chip carrier.

19. The method of claim 16, wherein:
the chip carrier comprises a plurality of additional cavities;
at least one additional cavity of the plurality of additional cavities comprises a given chip having one or more pads located within the at least one additional cavity;
each pad of the given chip is aligned with a corresponding connector pad of a microwave waveguide of the chip carrier; and
at least one of one or more pads of the given chip is coupled to its aligned corresponding connector of the chip carrier by way of an overlap capacitive coupling.

20. The method of claim 16, further comprising:
determining whether the functionality of the chip; and
upon determining that the chip is defective:
  removing the chip; and
  replacing the chip with a new chip.

\* \* \* \* \*